(12) United States Patent
Sobelman et al.

(10) Patent No.: US 6,313,660 B1
(45) Date of Patent: Nov. 6, 2001

(54) PROGRAMMABLE GATE ARRAY

(75) Inventors: Gerald Edward Sobelman, Minnetonka; David Parker, St. Paul, both of MN (US)

(73) Assignee: Theseus Logic, Inc., St. Paul, MN (US)

( * ) Notice: Subject to any disclaimer, the term of this patent is extended or adjusted under 35 U.S.C. 154(b) by 0 days.

(21) Appl. No.: 09/419,921

(22) Filed: Oct. 18, 1999

Related U.S. Application Data

(63) Continuation of application No. 08/947,165, filed on Oct. 8, 1997, now Pat. No. 5,986,466.

(51) Int. Cl.[7] .................................................. G06F 7/38
(52) U.S. Cl. ............................... 326/39; 326/35; 326/37
(58) Field of Search ............................ 326/39, 37, 35, 326/36, 44, 45

(56) References Cited

U.S. PATENT DOCUMENTS

| | | | |
|---|---|---|---|
| 4,845,633 | * | 7/1989 | Furtek ................................ 364/490 |
| 5,089,973 | | 2/1992 | Furtek . |
| 5,553,276 | | 9/1996 | Dean . |
| 5,614,844 | | 3/1997 | Sasaki et al. . |
| 5,646,554 | | 7/1997 | Kim et al. . |
| 5,656,948 | * | 8/1997 | Sobelman et al. ................. 326/35 |
| 5,986,466 | * | 11/1999 | Sobelman et al. ................. 326/39 |

FOREIGN PATENT DOCUMENTS

| | | |
|---|---|---|
| 0566739 A1 | 10/1993 | (EP) . |
| 0570584 A1 | 11/1993 | (EP) . |
| 0578821 A1 | 1/1994 | (EP) . |
| WO92/12498 | 7/1992 | (WO) . |
| WO92/16971 | 10/1992 | (WO) . |
| WO94/03929 | 2/1994 | (WO) . |

OTHER PUBLICATIONS

David E. Muller, Asynchronous Logics and Application to Information Processing, Stanford University Press, Switching Theory in Space Technology, pp. 289–297, 1963.

Narinder Pal Singh, A Design Methodology For Self–Timed Systems, Massachusetts Institute of Technology, MIT/LCS/TR–258, Feb. 1981.

(List continued on next page.)

Primary Examiner—Michael Tokar
Assistant Examiner—Anh Tran
(74) Attorney, Agent, or Firm—Steptoe & Johnson LLP

(57) ABSTRACT

A programmable gate array is disclosed for implementing asynchronous logic. In one embodiment, the array includes a set of cells, at least one of which includes a threshold gate having a plurality of inputs, an output, and a threshold value. Signals may assume an ASSERTED state having a logic meaning and a NULL state that has no logic meaning. The gate output switches to NULL when all inputs are NULL, and switches to the ASSERTED state when the number of ASSERTED inputs exceeds the threshold value. In the preferred embodiment, the gate exhibits hysteresis such that the output remains ASSERTED while the number of ASSERTED inputs remains greater than zero, less than the threshold value. In an alternate embodiment, an array of simplified threshold elements is used to form more complex threshold gates.

9 Claims, 3 Drawing Sheets

OTHER PUBLICATIONS

T.S. Anatharaman, A Delay Insensitive Regular Expression Recognizer, Dept. of Computer Science, Carnegie–Mellon University, CMU–CS–89–109, Jan. 1989.

Jens Sparso, et al., Design of Delay Insensitive Circuits Using Multi–Ring Structures, European Design Automation Conference, IEEE 0–8186–2780, pp. 15–20, Aug. 1992.

Lawrence G. Heller, et al., Cascode Voltage Switch Logic: A Different CMOS Logic Family, ISSCC 84 Digest of Technical Papers, IEEE, pp. 16–17, Feb. 1984.

Wojcik et al., On the Design of Three Valued Asynchronous Modules, IEEE Transacti on Computers, Oct. 1980, vol. C–29, No. 10, pp. 889–898.

Shibata et al., A Functional MOS Transistor Featuring Gate–Level Weighted Sum and Threshold Operations, IEEE Transactions On Electron Devices, Dec. 1992, vol. 39, No. 6, pp. 1444–1445.

Mark Edward Dean, Strip: A Self–Time Risc Processor, Jun. 1992.

M.R. Greenstreet, T.E. Williams, and J. Staunstrup, Self-Timed Iteration, Elsevier Science Publishers B.V. (North-Holland), IFIP, 1988, pp.309–322.

Teresa H.–Y. Meng, Robert W. Brodersen, and David G. Messerschmitt, Automatic Synthesis of Asnychronous Circuits from High–Level Specifications, IEEE Transactions on Computer–Aided Design, vol. 8, No. 11, Nov. 1989, pp. 1185–1191.

Ted Williams, Latency and Throughput Tradeoffs in Self-Timed Speed–Independent Pipelines and Rings, Stanford University Technical Report No. CSL–TR–91–482, May 1991.

Jens Sparso and Jorgen Staunstrup, Delay–insensitive multi-ring structures, Integration, the VLSI Journal 15, 1993, Elsevier Science Publishers B.V., pp. 313–340.

Tzyh–Yung Wuu and Sarma B.K. Vrudhula, A Design of a Fast and Area Efficient Multi–Input Muller C–element, IEEE Transactions on VLSI Systems, vol. 1, No. 2, Jun. 1993, pp. 215–219.

Marc Renaudin and Bachar El Hassan, The Design of Fast Asynchronous Adder Structures and Their Implementation Using D.C.V.S. Logic, Int'l. Symposium on Circuits & Systems, vol. 4, 1994, pp. 291–294.

Richard G. Burford, Xingcha Fan and Neil W. Bergmann, An 180 Mhz 16 bix Multiplier Using Asynchronous Logic Design Techniques, IEEE 1994 Custom Integrated Circuits Conference, pp. 215–218.

Ted Williams, Self–Timed Rings and Their Application to Division, Stanford University Technical Report No. CSL–TR–91–482, May 1991.

Stephen H. Unger, Asynchronous Sequential Switching Circuits, 1969, pp. 221–229.

Carver Mead & Lynn Conway, Introduction to VLSI Systems, 1980, pp. 242–262.

Ivan E. Sutherland, Micropipelines, Communications of the ACM, Dec. 1989, vol. 32, No. 6.

Hampel et al., Threshold Logic, IEEE Spectrum, May 1971, pp. 32–39.

Brzozowski et al., Asynchronous Circuits—Monographs in Computer Science, Springer–Verlag New York, Inc., 1995, New York, NY.

Supplementary European Search Report for EP 98 95 3297.

* cited by examiner

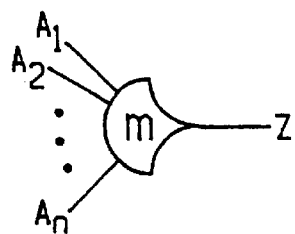
FIG. 1(a)
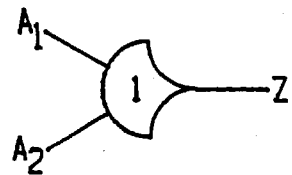
FIG. 1(b)
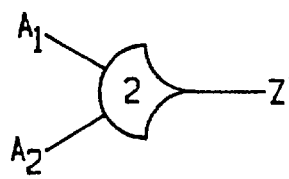
FIG. 1(c)
FIG. 1(d)
FIG. 2
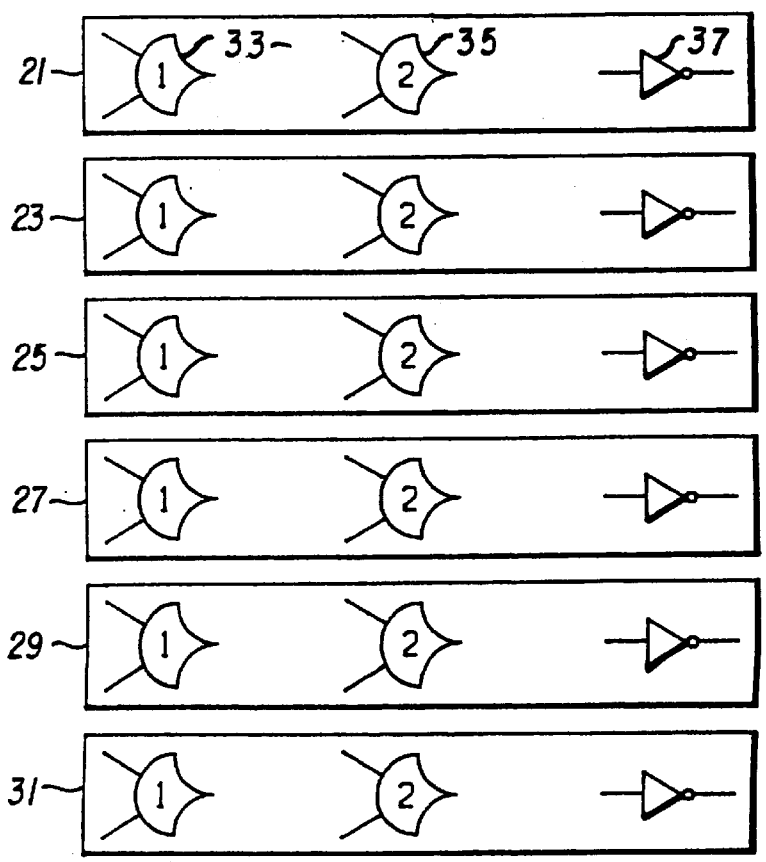

PROGRAMMABLE GATE ARRAY

This is a continuation of Application No. 08/947,165, filed Oct. 8, 1997 now U.S. Pat. No. 5,986,466.

FIELD OF THE INVENTION

The present invention relates to the field of electronics, and in particular to the use of programmable gate arrays for implementing asynchronous threshold gates for use in NULL Convention Logic circuits.

BACKGROUND

Previous logic systems, such as boolean logic systems, have employed clocking signals to regulate the sequential processing of binary logic signals. Typically, a logic circuit will respond to multiple inputs to generate an output. As input logic signals propagate through the circuit, the circuit output is unreliable for a period of time corresponding to worst case propagation delays through the individual logic gates. Typically, the output signal is sampled at a time when the output is stable, often by latching the output into a register. The sampling time is set according to an independent clock signal, i.e., one that is not derived from the states of the logic gates themselves.

Asynchronous circuits have been proposed that are intended to operate without an independent clock. One asynchronous logic paradigm is disclosed in U.S. Pat. No. 5,305,463 ("NULL Convention Logic"), which is incorporated herein by reference in its entirety. This paradigm uses logic gates referred to as threshold gates. Within this class, circuits are made with gates having varying numbers of inputs, and varying threshold values.

It is desirable to have a complete family of gates available for rapid prototyping and testing of multi-gate asynchronous circuits. Fabrication of custom integrated circuits is a method for producing a complete family of gates, however, custom fabrication involves turn-around time and cost. A faster and less costly approach to implementing a wide variety of threshold gates is desirable.

SUMMARY

The present invention provides a novel and efficient structure that can be used to implement NULL Convention Logic (NCL) using specifically designed programmable gate arrays. In general, gate arrays may be either field-programmable gate arrays (FPGAs) or mask-programmable gate arrays (MPGAs). In the former case, the circuits are programmed using electrical signals after the fabrication cycle has been completed. In the latter case, the circuits are programmed when the fabrication cycle has only been partially completed by completing the last set of processing steps using customized masks.

FPGAS, such as the Xilinx 4000-series chip, provide the capability for rapid prototyping of hardware systems. However, because of the relatively large nonrecurring engineering costs associated with fabrication, MPGAs are contemplated for high-volume applications after the design has already been fully debugged. The array architecture of the present invention may be used in both FPGA and MPGA implementations. These architectures can be used to implement a wide variety of NULL Convention threshold gates and larger circuits made from such gates. Thus, with the architecture of the present invention, a multi-gate design can be rapidly prototyped, and then easily migrated to the MPGA implementation for high-volume applications.

BRIEF DESCRIPTION OF THE DRAWING FIGURES

The present invention will be described below with reference to attached drawings in which:

FIGS. 1(a) through 1(d) illustrate graphic symbols for gates and inverters;

FIG. 2 illustrates an unprogrammed, six-cell programmable array of gates and inverters;

DETAILED DESCRIPTION OF THE PREFERRED EMBODIMENTS

Figure 3:
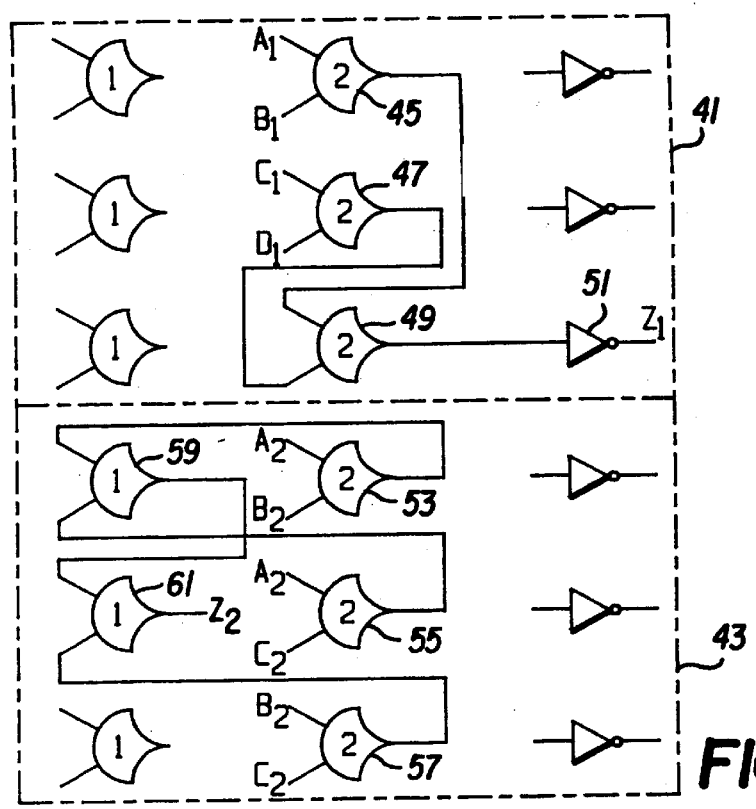
FIG. 3 depicts an example of the array of FIG. 2 programmed to perform two particular functions.

A wide variety of circuit-level implementations of threshold gates are disclosed in U.S. patent application Ser. No. 08/867,675, ("NULL Convention Threshold Gate") the contents of which are incorporated herein by reference in its entirety. The class of threshold gates disclosed in that application can be used to build a variety of larger circuit structures. Further information regarding the use of such gates can be found in U.S. Pat. No. 5,305,463. For clarity, certain symbology that was also used in application Ser. No. 08/867,675 will be included here.

FIGS. 1(a) through 1(d) illustrate graphic symbols for gates and inverters. FIG. 1(a) illustrates a general symbol for a threshold gate with hysteresis as also disclosed in the Application Ser. No. 08/867,675. Such gates are characterized by a plurality of physical input signal lines A1, A2, ..., An, and an output signal line Z. Input and output signals are characterized as having at least a first, meaningful logic state and a NULL state that has no logic meaning. In the preferred embodiment discussed herein, each input and output signal line has two voltage states, one of which represents the meaningful logic state and the other of which represents the NULL state. Such gates are also characterized by a switching characteristic in which the output switches to the NULL state when all inputs are NULL. The output switches to a meaningful logic state when the number of inputs in the meaningful logic state equals or exceeds a threshold value m. In the preferred embodiment of the implementation discussed herein, the gate will exhibit a hysteresis property such that the gate will hold the output in a meaningful (or non-NULL) logic state while the number of inputs in a meaningful (or non-NULL) logic state drops below the threshold value m. A variety of transitor-level implementations for such gates are shown in Application Ser. No. 08/867,675. FIG. 1(b) illustrates a graphic symbol for a 1-of-2 gate. This gate is characterized by: two inputs A1, A2; an output Z; and a threshold value of one (1). FIG. 1(c) illustrates a graphic symbol for a 2-of-2 gate. This gate is characterized by: two inputs A1, A2; an output Z; and a threshold value of two (2).

FIG. 1(d) illustrates a graphic symbol for an inverter. This inverter is used in implementations where an input may have one of two states: NULL, and a meaningful logic state that will be referred to as "ASSERTED." This inverter has a switching characteristic in which: (1) the output Z becomes NULL when the input is ASSERTED; and (2) the output becomes ASSERTED when the input is NULL.

Generally speaking, threshold gates can be configured to operate in a static, semi-static, semi-dynamic, or dynamic fashion. They can also be configured to represent NULL as any state, e.g., as a high voltage or as a low voltage when two voltage states are used. The threshold gates shown herein will be discussed with reference to a dynamic implementation where the NULL state is a positive voltage level and the ASSERTED state is a zero voltage level.

The present invention relates to a novel structure for implementing programmable arrays to implement NULL Convention Logic. As will be described below in greater detail, the present invention comprises an array of elements which form, or can be used to form, NCL threshold gates for both FPGA and MPGA implementations.

NCL gates can be classified into two categories. The first type comprises threshold gates having a threshold value of 1, which will be referred to hereinafter as "nominal threshold gates." The second type comprises threshold gates having a threshold value greater than 1, which will be referred to hereinafter as "higher-level threshold gates."

The nominal threshold gates do not have hysteresis. For example, in an implementation where each signal line can assume one of two voltage states (five (5) volt NULL and ground ASSERTED), a 1-of-2 gate has a switching characteristic similar to a conventional Boolean AND gate. That is: (a) the gate output will be five (5) volts (NULL) whenever both of the two inputs are five (5) volts; and (b) the gate output will be zero (0) volts (ASSERTED) whenever either or both of the inputs are zero (0) volts. Nominal threshold gates with more than two inputs can be constructed using combinations of 1-of-2 threshold gates.

Higher level threshold gates have hysteresis. For example, a 2-of-3 gate has three (3) inputs and a threshold of two (2). If all three inputs are NULL, the output is NULL. If only one of the three NULL inputs switches to become ASSERTED, the output will remain NULL. If two or three of the three NULL inputs switch to become ASSERTED, the output will switch to become ASSERTED. After having switched to the ASSERTED state, the output will remain ASSERTED if one of the inputs remains ASSERTED while the other two inputs are NULL. Higher level threshold gates can be constructed using combinations of 2-of-2 threshold gates and nominal threshold gates.

In addition to threshold gates, NCL logic systems sometimes use inverters, e.g., as completion detectors as disclosed in U.S. patent application Ser. No. 08/318,508 ("Asynchronous Register"). Thus, it is also desirable to include inverters with the circuits of the present invention. In an implementation where each signal line can assume one of two voltage states (NULL and ASSERTED), an inverter has a switching characteristic similar to a Boolean inverter.

By arranging these basic elements in a programmable array, a variety of NCL functions can be implemented by interconnecting the elements in a particular desired configuration. The programmable array of the present invention can be implemented in a variety of ways to meet the required design parameters.

In one embodiment, a uniform array could be provided in which each cell in the array is identical. By way of example, only one type of cell would be required. At a minimum, this cell would include one inverter, a 1-of-2 threshold gate, and a 2-of-2 threshold gate. However, it would also be possible to enlarge the cell so that it would contain more than one copy of one or more of these three elements. In this way, a designer could tailor the relative proportions of each type of element in any desired way to meet a variety of design parameters and requirements.

In an alternate embodiment, a non-uniform array could be provided having several different types of cells, which provides greater flexibility to the designer wishing to use the array. An alternative could be to incorporate several different types of higher level threshold gates, rather than using just the 2-of-2 threshold gate. For example, a cell could contain a combination of 2-of-2, 2-of-3, 3-of-4 and 4-of-5 threshold gates in addition to the inverter and the 1-of-2 threshold gates. It should be noted, however, that using a wider variety of threshold gates may result in increasing the cost of the programmable array, and the increased versatility achieved with a non-uniform array should be balanced against the added cost.

The structure and operation of an NCL programmable array according to the present invention is illustrated below using some examples.

FIG. 2 shows an unprogrammed array of six cells. The array includes six identical cells 21, 23, 25, 27, 29, 31. Cell 21 includes a 1-of-2 gate 33, a 2-of-2 gate 35, and an inverter 37. The other cells 23, 25, 27, 29, 31 are identical. Although six such cells are shown in FIG. 2, it should be readily apparent that programmable arrays can be manufactured with any number of cells, as well as with different types of cells, as discussed above.

The basic elements of the six unprogrammed cells can be interconnected any number of ways to perform different NCL functions. FIG. 3 depicts an example of the array of FIG. 2 after it has been programmed with interconnections to perform two particular functions. A first part of the array 41 includes three (3) 2-of-2 gates 45, 47, 49 and an inverter 51 connected to form a 4-of-4 gate which can be used as a completion detector. This circuit generates an ASSERTED signal at output Z1 when all inputs A1, B1, C1, D1 are NULL, and it generates a NULL signal at output Z1 when all inputs A1, B1, C1, D1 are ASSERTED. More particularly, the output of a first 2-of-2 gate 45 will be ASSERTED when both inputs A1, B1 are asserted. The output of a second 2-of-2 gate 47 will be ASSERTED when both inputs C1, D1 are ASSERTED. The output of a third 2-of-2 gate 49 will be ASSERTED when the outputs of both other 2-of-2 gates 45, 47 are ASSERTED, i.e., when all four inputs A1, B1, C1, D1 are ASSERTED. The output of the inverter 51 will be NULL when the output of the third 2-of-2 gate 47 is ASSERTED. The outputs of the 2-of-2 gates 45, 47, 49 will be NULL when all inputs A1, B1, C1, D1 are NULL, and the output of the inverter 51 will be ASSERTED when the output of 2-of-2 gate 49 is NULL.

A circuit in the second part of the array 43 includes three (3) 2-of-2 gates 53, 55, 57 and two (2) 1-of-2 gates 59, 61 connected to form a 2-of-3 threshold gate. Three inputs A2, B2, C2 are connected in pairs to the three 2-of-2 gates 53, 55, 57. If any two of the three inputs A2, B2, C2 are ASSERTED, a corresponding 2-of-2 gate will generate an ASSERTED output. A first 1-of-2 gate 59 monitors outputs from two (2) of the 2-of-2 gates 53, 55. A second 1-of-2 gate 61 monitors the output from the third 2-of-2 gate 57, and also monitors the output of the first 1-of-2 gate 59. Thus, if one or more pairs of inputs A2, B2, C2 are ASSERTED, then the Z2 output of 1-of-2 gate 61 will be ASSERTED. Furthermore, when all three inputs A2, B2, C2 return to NULL, the outputs of all five gates 53, 55, 57, 59, 61 will return to NULL, including the Z2 output.

Figure 4:
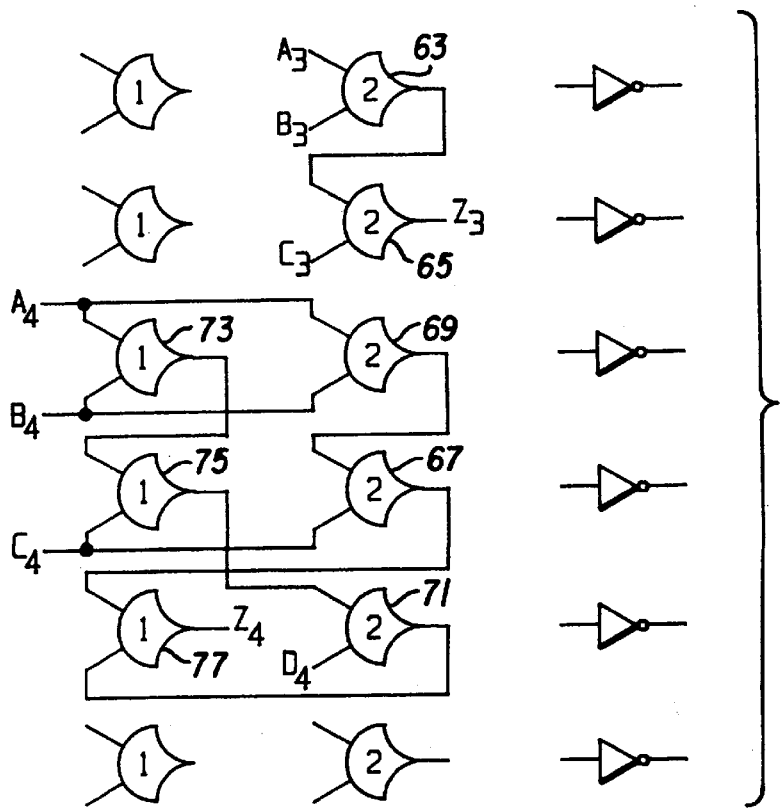
FIG. 4 shows an example of the array of FIG. 2 programmed to perform two additional functions.

FIG. 4 shows an example of the array of FIG. 2 programmed to perform two additional functions. The first function Z3 is a 3-of-3 gate for inputs A3, B3, C3. A first 2-of-2 gate 63 generates an ASSERTED output when two inputs A3, B3 are ASSERTED, and generates a NULL output when both inputs A3, B3 are NULL. A second 2-of-2 gate 65 generates an ASSERTED output when: (a) the output of the first 2-of-2 gate 63 is ASSERTED and, (b) the third input C3 is asserted. The second 2-of-2 gate 65 generates a NULL output when the output of the first 2-of-2 gate 63 and the third input C3 are NULL.

The second function Z4 is a 3-of-5 gate for inputs A4, B4, C4, D4, where the fourth input D4 is given a weight of two. In terms of threshold logic, the output Z4 will be NULL when all inputs A4, B4, C4, D4 are NULL. The output Z4 will be asserted when any of the following conditions is met: (a) D4 is asserted and any one of inputs A4, B4, C4 is asserted; or (b) A4, B4, and C4 are asserted. This circuit operates as follows.

A first 2-of-2 gate 67 (operating in conjunction with a second 2-of-2 gate 69) will have an ASSERTED output if the first condition is met. More specifically, the second 2-of-2 gate 69 will have an ASSERTED output if both inputs A4 and B4 are ASSERTED. The first 2-of-2 gate 67 will have an ASSERTED output if the output of the second 2-of-2 gate is asserted and if the input C4 is ASSERTED (i.e., if all three inputs A4, B4, and C4 are asserted).

A third 2-of-2 gate 71 (operating in conjunction with two 1 of 2 gates 73, 75) will have an ASSERTED output if the second condition is met. More specifically, the two 1-of-2 gates 73, 75 are connected together to form a 1-of-3 gate. The output of the first 1-of-2 gate 73 will be ASSERTED if any one of the two inputs A4, B4 are ASSERTED. The output of the second 1-of-2 gate 75 will be ASSERTED when the output of the first 1-of-2 gate 73 is ASSERTED or input C4 is asserted (i.e., when any one of the inputs A4, B4, C4 is ASSERTED). The output of the third 2-of-2 gate 71 will be ASSERTED if the output of the second 1-of-2 gate 75 is asserted and if the input D4 is ASSERTED (i.e., when any one of the inputs A4, B4, C4 is asserted and input D4 is asserted). The output of the third 2-of-2 gate 71 will be NULL when all four inputs A4, B4, C4, D4 are NULL.

A third 1-of-2 gate 77 generates the final output Z4. The output Z4 of this third 1-of-2 gate 77 will be asserted when the output of either of gates 67, 71 is asserted. Each of the gates 67, 71 tracks one of the two conditions for which the output Z4 should be asserted. Thus, the output from the third 1-of-2 gate 77 provides the desired function of a 3-of-5 threshold gate (with a weight of 2 for the D4 input).

The embodiments above illustrate several examples of forming threshold gates having multiple inputs and thresholds higher than one (1). The basic elements of the cells can be connected to form entire families of m-of-n threshold gates where n is the number of inputs and m is a threshold that may be less than n.

As alternative embodiments, programmable gate arrays can be constructed to include one or more pre-designed, higher level circuits. A gate array can be designed to include the six unprogrammed cells shown in FIG. 2, and additionally (or in place of a number of cells) contain any m-of-n threshold gate disclosed in U.S. patent application Ser. No. 08/867,675.

Figure 5:
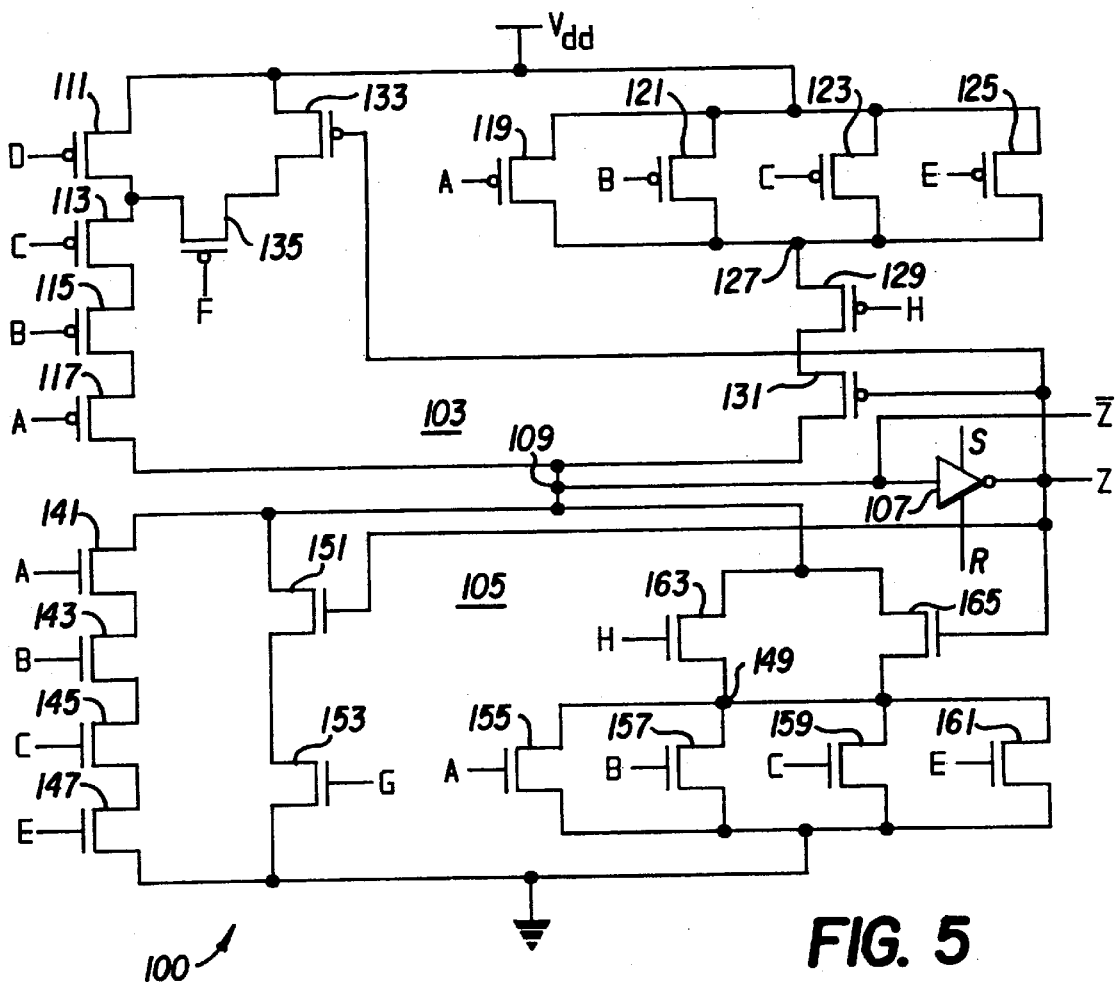
FIG. 5 is a transistor-level schematic drawing for an alternate cell circuit for implementing NULL convention threshold gates with programmable gate arrays.

FIG. 5 is a transistor-level schematic drawing for an alternate cell circuit 100 for implementing NULL convention threshold gates. The circuit 100 can implement a 1-of-2, 1-of-3, 1-of-4, 2-of-2, 3-of-3, 4-of-4, 2-of-3, or 3-of-5 (with weight of 2 for one input) threshold gate. Moreover, the implementation of the 2-of-2, 3-of-3, 4-of-4, 2-of-3, and 3-of-5 (with weight of 2 for one input) includes an operational reset to NULL or set to ASSERTED feature. In the disclosed circuit, NULL will be assigned to the ground voltage level and ASSERTED will be assigned to the Vdd voltage level. It will be appreciated that similar circuits can be designed where NULL is assigned the high voltage level, and ASSERTED is assigned the ground voltage level. This can be accomplished, for example, by replacing N-MOS devices with P-MOS devices (and vice versa), and reversing the Vdd and ground connections.

The cell 100 has eight primary inputs A, B, C, D, E, F, G, H, a set input S, a reset input R, and two outputs Z, $\overline{Z}$, where $\overline{Z}$ is the inverse of Z. The circuit 100 can be configured to function as different threshold gates by setting configuration inputs F, G, H to Vdd or ground, and by connecting data inputs A, B, C, D as described more fully below. The configuration inputs may be set to appropriate voltage levels by external connections, or by making internal programmable connections (e.g., in fabrication masks).

The cell circuit 100 is made up of three general sub-circuits, including a pull-up sub circuit 103, a pull-down sub-circuit 105, and an output sub-circuit 107. The output sub-circuit 107 is an inverter whose output is the Z output of the cell circuit 100. The output sub-circuit 107 has an input connected to a common signal node 109. The $\overline{Z}$ output receives, as an input, the signal on the common signal node 109.

The pull-up sub-circuit is a transistor circuit that connects the common signal node 109 to Vdd in response to certain combinations of inputs A, B, C, D, E, F, H. The pull-up sub-circuit 103 includes four P-MOS transistors 111, 113, 115, 117 connected in series between Vdd and the common signal node 109. The first transistor 111 of the series connects to Vdd and to the second transistor 113 in the series. Each of these series P-MOS transistors 111, 113, 115, 117 receives, as a gate input, one of the four data inputs A, B, C, D. The first transistor 111 of the series receives the D input. Two P-MOS bypass transistors 133, 135 connect in series between Vdd and the junction between the first series transistor 111 and the second transistor 113. Thus, the two bypass transistors 133, 135 form an alternate connection path between Vdd and the second series transistor 113. The first of the two bypass transistors 133 receives, as its gate input, the output Z. The second of the two bypass transistors 135 receives, as its gate input, the configuration input F.

The pull-up sub-circuit 103 also include a set of four P-MOS transistors 119, 121, 123, 125 connected in parallel between Vdd and a pull-up sub-circuit node 127. Two P-MOS transistors 129, 131 connect in series between the pull-up sub-circuit node 127 and the common signal node 109. The first of these transistors 129 receives, as a gate input, the configuration input H. The second of these transistors 131 receives, as a gate input, the Z output.

The pull-down sub-circuit 105 is a transistor circuit that connects the common signal node 109 to ground in response to certain combinations of inputs A, B, C, E, G, H. The pull-down sub-circuit 105 includes four N-MOS transistors 141, 143, 145, 147 connected in series between the common signal node 109 and ground. Each of these series N-MOS transistors 141, 143, 145, 147 receives, as a gate input, one of the four data inputs A, B, C, E.

The pull-down sub-circuit 105 also includes two N-MOS transistors 151, 153 connected in series between the common signal node 109 and ground. The first of these two N-MOS transistors 151 receives, as a gate input, the output Z. The second of these two N-MOS transistors 153 receives, as a gate input, the configuration input G.

The pull-down sub-circuit 105 additionally includes a set of four N-MOS transistors 155, 157, 159, 161 connected in parallel between ground and a pull-down sub-circuit node 149. Two N-MOS transistors 163, 165 connect in parallel between the pull-down sub-circuit node 149 and the common signal node 109. The first of these transistors 163 receives, as a gate input, the configuration input H. The second of these transistors 131 receives, as a gate input, the Z output.

The cell circuit 100 can be configured as any of several n-of-n gates (e.g., 2-of-2, 3-of-3, or 4-of-4) by setting the F input to Vdd, by setting the G and H inputs to ground, and by connecting the signal inputs as follows. For two input signals alpha and beta, the cell circuit 100 functions as a 2-of-2 by connecting the alpha signal to both A and B inputs, and by connecting the beta signal to the C, D, and E inputs. For three input signals alpha, beta, and gamma, the cell circuit 100 functions as a 3-of-3 gate by connecting the alpha signal to the A and B inputs, by connecting the beta signal to the C input, and connecting the gamma input to the D and E inputs. For four input signals alpha, beta, gamma, and delta, the cell circuit 100 functions as a 4-of-4 gate by connecting alpha to the A input, connecting beta to the B input, connecting gamma to the C input, and connecting delta to the D and E inputs. For any of these n-of-n functions, the cell circuit 100 can be set to ASSERTED or reset to NULL by setting or resetting the output sub-circuit 107 as discussed more fully below.

The cell circuit 100 can be configured as any of several 1-of-n gates (e.g., 1-of-2, 1-of-3, or 1-of-4) by setting the F and H inputs to Vdd, and by setting the G input to ground. Then the inputs would be connected as follows. For 2 input signals alpha and beta, the cell circuit 100 functions as a 1-of 2 gate by connecting the alpha signal to the A and B inputs, and by connecting the beta signal to the C, D, and E inputs. For three input signals alpha, beta, gamma, the cell circuit 100 functions as a 1-of-3 gate by connecting the alpha signal to the A and B inputs, by connecting the beta signal to the C input, and by connecting the gamma signal to the D and E inputs. For four signal inputs alpha, beta, gamma, and delta, the cell circuit 100 functions as a 1-of-4 gate by connecting the alpha signal to the A input, by connecting the beta signal to the B input, by connecting the gamma input to the C input, and by connecting the delta input to the D and E inputs.

The cell circuit 100 can be configured as an inverter by setting the F and H configuration inputs to Vdd, and by setting the G input to ground. Then the cell functions as an inverter by connecting an input signal alpha to all five inputs A, B, C, D, and E.

The cell circuit 100 can be configured as a 2-of 3 gate or as a 3-of 5 gate (with weight of 2 for the D input) by setting the F configuration input to ground. For three input signals alpha, beta, and gamma, the cell circuit 100 functions as a 2-of-3 gate by connecting the alpha signal to A and B inputs, by connecting the beta signal to the C and E inputs, and by connecting the gamma signal to the D, G, and H inputs. For four input signals alpha, beta, gamma, and delta (with the delta input to have a weight of two), the cell circuit 100 functions as a 3-of-5 gate (with weight of 2 for the D input) by connecting the alpha signal to the A input, by connecting the beta signal to the B input, by connecting the gamma signal to the C and E inputs, and by connecting the delta signal to the D, G and H inputs. For any of these n-of-n functions, the cell circuit 100 can be set to ASSERTED or reset to NULL by setting or resetting the output sub-circuit 107 as discussed more fully below.

Figure 6:
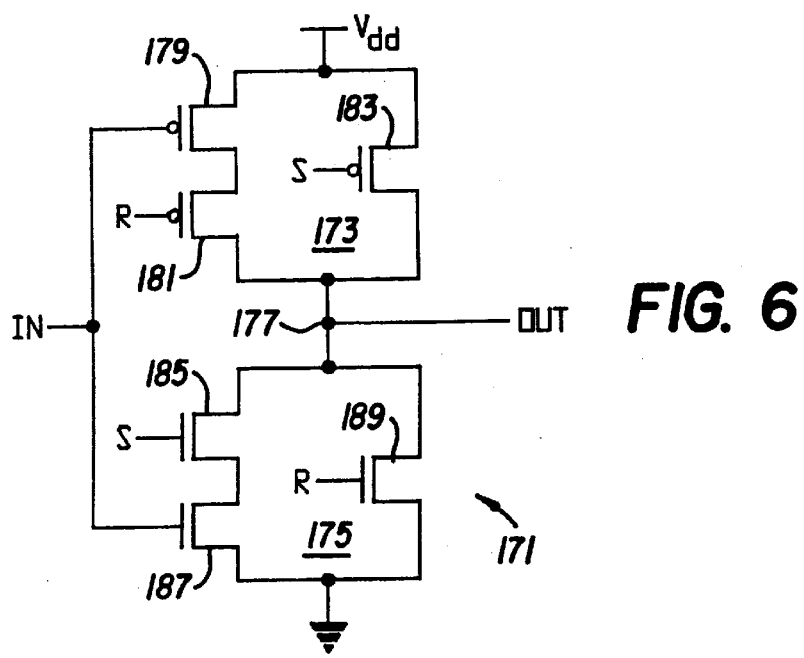
FIG. 6 is a transistor-level schematic drawing for a inverter used in the cell circuit of FIG. 5.

FIG. 6 is a transistor-level schematic drawing for a inverter circuit 171 used in the cell of FIG. 5. The inverter circuit 171 includes a pull-up sub-circuit 173 and a pull down sub-circuit 175 connected at a common output signal node 177.

The pull-up sub-circuit 173 includes a pair of P-MOS transistors 179, 181 connected in series between Vdd and the output signal node 177. The first series P-MOS transistor 179 receives, as a gate input, the inverter circuit input IN. The second series P-MOS transistor 181 receives, as a gate input, the reset input R. The pull-up sub-circuit 173 also includes a single P-MOS transistor 183 connected between Vdd and the output signal node 177. The single P-MOS transistor 183 receives, as a gate input, the set input S.

The pull-down sub-circuit 175 includes a pair of N-MOS transistors 185, 187 connected in series between the output signal node 177 and ground. The first series N-MOS transistor 185 receives, as a gate input, the set inputs S. The second series N-MOS transistor 187 receives, as a gate input, the inverter circuit input IN. The pull-down sub-circuit 173 also includes a single N-MOS transistor 189 connected between the output signal node 177 and ground. The single N-MOS transistor 189 receives, as a gate input, the reset input R.

The inverter has three modes of operation. When R=Vdd and S=Vdd, the output is forced to ground, regardless of the input signal IN. When R=ground and S=ground, the output is forced to Vdd, regardless of the input signal IN. When R=ground and S=Vdd, the value of the output is the compliment of the input. The combination R=Vdd and S=ground is not allowed.

In addition to the cells and elements described above, the programmable arrays of the present invention would also include a network of routing resources for interconnecting the gates and inverters in desired configurations. In the case of the FPGA, the routing network would include programmable switches. In the case of the MPGA, the routing network would be established by the patterns on the customized mask layers. A manufactured version of the programmable array could also include other elements, such as external pins, heat sinks, and other features that are not shown or discussed, but which will be apparent to those in the art without further need for description.

Although the present invention has been described with reference to the particular preferred embodiments, various modifications and variations can be made that will be apparent to those in the art and which will fall within the scope of the present invention as defined by the appended claims.

What is claimed is:

1. A cell for a programmable logic array comprising:
   at least one nominal threshold gate;
   at least one higher level threshold gate, said higher level threshold gate having a switching characteristic in which:
      the higher level threshold gate circuit switches its output to a NULL state when all of a plural number of inputs "n" are NULL;
      the higher level threshold gate circuit switches its output to an ASSERTED state when a plural number of ASSERTED inputs exceeds a threshold number "m"; and
      the higher level threshold gate maintains a non-NULL output when a number of ASSERTED inputs falls to less than "m" and greater than zero (0).

2. The cell for a programmable logic array as in claim 1, further comprising at least one inverter.

3. The cell for a programmable logic array as in claim 1, wherein the threshold number "m" is less than or equal to the plural number of inputs "n".

4. The cell for a programmable logic array as in claim 1, wherein:
  the nominal threshold gate is a 1-of-2 threshold gate; and
  the higher level threshold gate is a 2-of-2 threshold gate.

5. A cell for a programmable logic array comprising:
  a 1-of-2 threshold gate; and
  a 2-of-2 threshold gate with hysteresis, said 2-of-2 threshold gate having first and second inputs and an output, said 2-of-2 gate further characterized by a switching characteristic in which:
    the 2-of-2 gate switches its output to a NULL state when both first and second inputs are NULL;
    the 2 of 2 gate switches its output to an ASSERTED state when the first and second inputs are ASSERTED; and
    the 2-of-2 gate maintains an ASSERTED state when precisely one of the first and second inputs is NULL.

6. The cell for a programmable logic array as in claim 5, further comprising at least one inverter.

7. A cell circuit for a programmable logic array, comprising:
  a plurality of subcircuits, each subcircuit providing a predetermined function;
  a plurality of input nodes connecting to at least one of said subcircuits, said input nodes including at least one configuration input node and data input nodes;
  the cell circuit configured to function as at least one threshold gate by setting a connection of said at least one configuration input node and said data input nodes, at least one of said threshold gates having "n" data inputs and switching its output state to a non-meaningful state when all "n" data inputs are non-meaningful and switching its output state to an asserted state when a plural number of asserted data inputs exceeds a threshold number "m";
  the at least one threshold gate maintaining a meaningful output state when a number of asserted data inputs falls to less than "m" and greater than zero (0).

8. The cell circuit for a programmable logic array as in claim 7, wherein "m" is less than or equal to "n".

9. The cell circuit for a programmable logic array of claim 7, wherein said subcircuits include at least one of a pull-up circuit, a pull-down circuit, and an output circuit.

* * * * *